(12) United States Patent
Steger et al.

(10) Patent No.: US 7,965,516 B2
(45) Date of Patent: Jun. 21, 2011

(54) POWER SEMICONDUCTOR MODULE AND METHOD FOR ITS PRODUCTION

(75) Inventors: Jürgen Steger, Hiltpoltstein (DE); Marco Lederer, Nürnberg (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 12/505,950

(22) Filed: Jul. 20, 2009

(65) Prior Publication Data
US 2010/0039774 A1    Feb. 18, 2010

(30) Foreign Application Priority Data
Jul. 19, 2008  (DE) .................. 10 2008 033 852

(51) Int. Cl.
*H05K 7/20*    (2006.01)

(52) U.S. Cl. ........ 361/715; 361/704; 361/707; 361/717; 165/80.1; 257/712; 257/719

(58) Field of Classification Search .................. None
See application file for complete search history.

(56) References Cited

U.S. PATENT DOCUMENTS

| | | | | |
|---|---|---|---|---|
| 5,705,853 A | * | 1/1998 | Faller et al. | 257/719 |
| 5,808,868 A | * | 9/1998 | Drekmeier | 361/704 |
| 6,104,614 A | * | 8/2000 | Chou et al. | 361/704 |
| 6,704,206 B2 | * | 3/2004 | Martin et al. | 361/760 |
| 6,791,183 B2 | * | 9/2004 | Kanelis | 257/718 |
| 7,034,395 B2 | | 4/2006 | Stolze | |
| 7,291,914 B2 | * | 11/2007 | Stolze | 257/719 |
| 7,477,518 B2 | * | 1/2009 | Stolze et al. | 361/715 |
| 7,692,293 B2 | * | 4/2010 | Apfelbacher et al. | 257/710 |
| 2010/0039774 A1 | | 2/2010 | Steger et al. | |

FOREIGN PATENT DOCUMENTS

DE    101 49 886        4/2003
DE    10 2008 033 852   9/2009

\* cited by examiner

*Primary Examiner* — Boris L Chervinsky
(74) *Attorney, Agent, or Firm* — Cohen Pontani Lieberman & Pavane LLP

(57) ABSTRACT

A power semiconductor module that includes a substrate having at least one power semiconductor element; a heat sink for dissipation of heat from the at least one power semiconductor element and a housing having a cutout which is arranged on a lower face of the housing facing the heat sink and holds the substrate; and to a method for production of such power semiconductor modules. The power semiconductor module has at least one holding element, which engages in a recess, which is associated with the at least one holding element, on the lower face of the housing and is designed such that it limits any movement of the substrate in the direction of the lower face of the housing.

17 Claims, 6 Drawing Sheets

POWER SEMICONDUCTOR MODULE AND METHOD FOR ITS PRODUCTION

BACKGROUND OF THE INVENTION

1. Field of the Invention

The invention relates to a power semiconductor module, comprising: a substrate with at least one power semiconductor element; a heat sink for dissipation of waste heat from the at least one power semiconductor element; and a housing having a cutout which is arranged on a lower face of the housing facing the heat sink, for holding the substrate. The invention also relates to a method for production of such a power semiconductor module.

2. Description of the Related Art

Modules of the type described are generally known, for example, from German Patent DE 101 49 886 A1. This document describes a power semiconductor module without a base plate, in which the lower face of the substrate is pressed by a pressing apparatus against a heat sink, via which power losses which occur in the form of heat during operation of the power semiconductor module are dissipated.

To improve the heat transmission from the substrate to the heat sink, it has been found to be advantageous to coat the lower face of the substrate with a thermally conductive layer. For example, a thermally conductive paste can be applied to the lower face of the substrate.

Coated power semiconductor modules without base plates such as these are highly sensitive to being detached from the heat sink. The substrate can become detached from the housing when the substrate is removed, because of the high adhesion exhibited by the thermally conductive paste.

SUMMARY OF THE INVENTION

One object of the invention is to provide an improved power semiconductor module of the type described. A further object of the invention is to provide a method for production of an improved arrangement such as this.

Briefly stated, the inventive power semiconductor module comprises a substrate having at least one power semiconductor element, a heat sink for dissipation of waste heat from the at least one power semiconductor element, and a housing having a cutout which is arranged on a lower face of the housing facing the heat sink, for holding the substrate. The object is achieved in that the power semiconductor module has at least one holding element, which engages a recess in the lower face of the housing to limit any movement of the substrate in the direction of the lower face of the housing.

An arrangement such as this has the advantage that the substrate together with the power semiconductor elements cannot become detached from the housing when removed from the heat sink. The holding element holds the substrate in the housing while it is being removed. The holding element makes it possible to detach the substrate together with the housing from the heat sink.

The holding element is not formed on the housing and is not formed integrally with the housing, but is a separate, autonomous component, which is mounted on the housing when the individual elements of the arrangement are joined together. The holding element may be formed from any desired material, preferably from plastic or metal.

For the method for production of an arrangement such as this, the object is achieved by the following steps:
providing a housing having a lower face which includes a cutout and recess
inserting a substrate having at least one power semiconductor element into the cutout in the housing;
inserting at least one holding element into the recess in the housing, to limit movement of the substrate in the direction of the lower face of the housing; and
mounting the housing on the heat sink, with the lower face of the housing being arranged on the heat sink.

A method such as this can be carried out quickly and easily, resulting in the advantage as mentioned above when the housing is being removed from the heat sink.

Preferred refinements of the invention will be explained in the following description.

It has been found to be advantageous for the arrangement for the at least one holding element to be designed such that, when the housing is mounted on the heat sink, it engages in an associated recess in the heat sink to position the housing on the heat sink. This allows the housing, and therefore the substrate, to be centered on the heat sink. The substrate is pre-centered with the aid of the holding element during assembly, preventing movement of the substrate during assembly.

This preferred refinement avoids the disadvantages which result if the housing is not pre-centered during assembly of the module. This is because the lack of pre-centering runs the risk of the substrate being moved relative to the housing and projecting under the housing edge during any position correction of the housing that is subsequently carried out on the heat sink, as a result of the adhesion of the thermally conductive paste, by means of which the substrate may then be damaged.

For the inventive method of manufacture, it has been shown advantageous to apply a thermally conductive layer which is formed from a thermally conductive paste to that face of the substrate which faces the heat sink, before the at least one holding element is introduced into the recess in the housing. As before, the thermally conductive paste can therefore easily be applied to the substrate in one coating or printing process, without interfering with the holding elements. Once the coating or printing process has been completed, the holding elements are introduced into the recesses in the housing provided therefore.

This preferred refinement of the method according to the invention therefore avoids the disadvantages which result when a centering element is formed, for example molded, on the housing during the production of the housing, to center the housing. The process of forming a centering element on the housing, as has been practiced in previously known methods, specifically makes the printing of thermally conductive paste onto a substrate which is located in the housing impossible or at least difficult. In contrast to the prior art, the holding element according to the invention can be arranged on the housing after coating of the substrate.

Furthermore, it has also been found to be advantageous for the arrangement for the recess in the heat sink and a section of the holding element which faces the heat sink and engages the recess to have mutually corresponding shapes. The better the shapes of the recess in the heat sink and of the section of the holding element which engages in it match, the more precisely the housing can be pre-centered on the heat sink. In one preferred refinement, the shapes of the recess in the heat sink and of the section of the holding element which engages in it are matched to one another so that the holding element is capable of virtually no movement in the recess in the heat sink in a direction parallel to the plane which lies between the heat sink and the housing. This makes it possible for the holding element to ensure that the housing assumes a precise and predefined position on the heat sink.

It is particularly preferable for a section of the holding element which faces the heat sink to be cylindrical. One preferred shape of that section of the holding element which faces the heat sink is a cylindrical shape with a chamfer, that is to say with an incline on the edge facing the heat sink. It is also preferable for the holding element to be hollow internally, for example having a continuous, preferably cylindrical, cutout along its longitudinal axis.

The at least one holding element preferably has a projection which projects into the cutout for holding the substrate and limits the movement of the substrate in the direction of the lower face of the housing. The projection on the holding element can be produced easily and forms a mechanically reliable holding apparatus.

It is also preferable for the housing to have a circumferential housing frame in which the recess in which the holding element engages is arranged.

It has been particularly proven for the recess on the lower face of the housing to be in the form of a blind hole which is open towards the lower face of the housing and in which the at least one holding element engages from the lower face of the housing.

In particular, it has been proven for the at least one holding element to be in the form of a latching/centering holder. The power module is pre-centered owing to a combined latching/centering holder during assembly, with movement of the substrate at the same time being prevented during assembly. At the same time, the substrate is held in the housing by the latching/centering holder during removal. The substrate can thus be detached from the heat sink.

The at least one holding element is preferably connected to the housing by means of a detachable connection. In particular, in this context, it has been proven for the detachable connection to be in the form of a screw connection, that is to say that on a section which engages in the housing recess, the holding element has an external thread, and the housing recess has an internal thread which mates with the external thread. It is also possible that on a section which engages in the housing recess, the holding element has at least one spring latching finger and the housing recess has a latching depression which is formed complementarily to the latching finger.

In one preferred refinement of the invention, the at least one holding element is fixed in the associated housing recess by means of an adhesively bonded connection.

It is also for the power semiconductor module to have at least two, and, more preferably, at least three holding elements. The recesses which are associated with the at least two holding elements are arranged on the lower face of the housing, preferably on opposite faces of the housing, in particular diagonally opposite one another. The arrangement of at least two or at least three holding elements has the advantage that the substrate is held securely in the recess in the housing. In addition, it may be advantageous for the at least two or at least three holding elements to allow particularly good pre-centering of the housing in a plurality of directions on the heat sink.

In particular, it is preferred for the arrangement to have a thermally conductive layer, which is formed from a thermally conductive paste, between the substrate and the heat sink. This makes it possible to critically improve the heat transmission of the waste heat from the power semiconductor element which is located on the substrate to the heat sink which dissipates the waste heat.

For the method for production of the arrangement, it has been found to be advantageous for the housing to be positioned on the heat sink such that the at least one holding element engages in an associated recess in the heat sink. This allows the housing to be centered on the heat sink.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained, by way of example, with reference to the Figures, in which.

DETAILED DESCRIPTION OF THE PRESENTLY PREFERRED EMBODIMENTS

Figure 1:
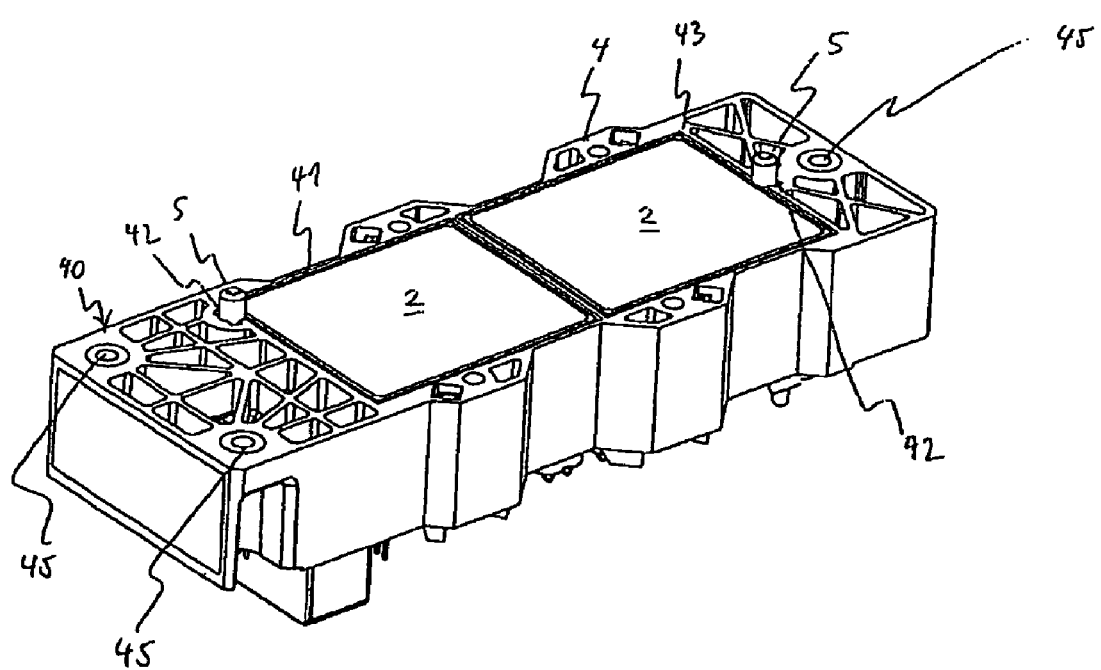
FIG. 1 is a perspective view of the lower face of the inventive housing.

FIG. 1 shows a lower face 40 of a housing 4 which has a cutout 41 for holding two substrates 2. Substrates 2 may, for example, be in the form of direct copper bonded (DCB) substrates. Attachment holes 45, through which screws (not shown) can be passed, are located in housing 4, and are used for mounting housing 4 on a heat sink (FIG. 3). On its lower face 40, housing 4 has a circumferential frame 43, in which recesses 42 for holding elements 5 are arranged. Recesses 42 may be formed as blind holes open towards lower face 40.

Figure 2:
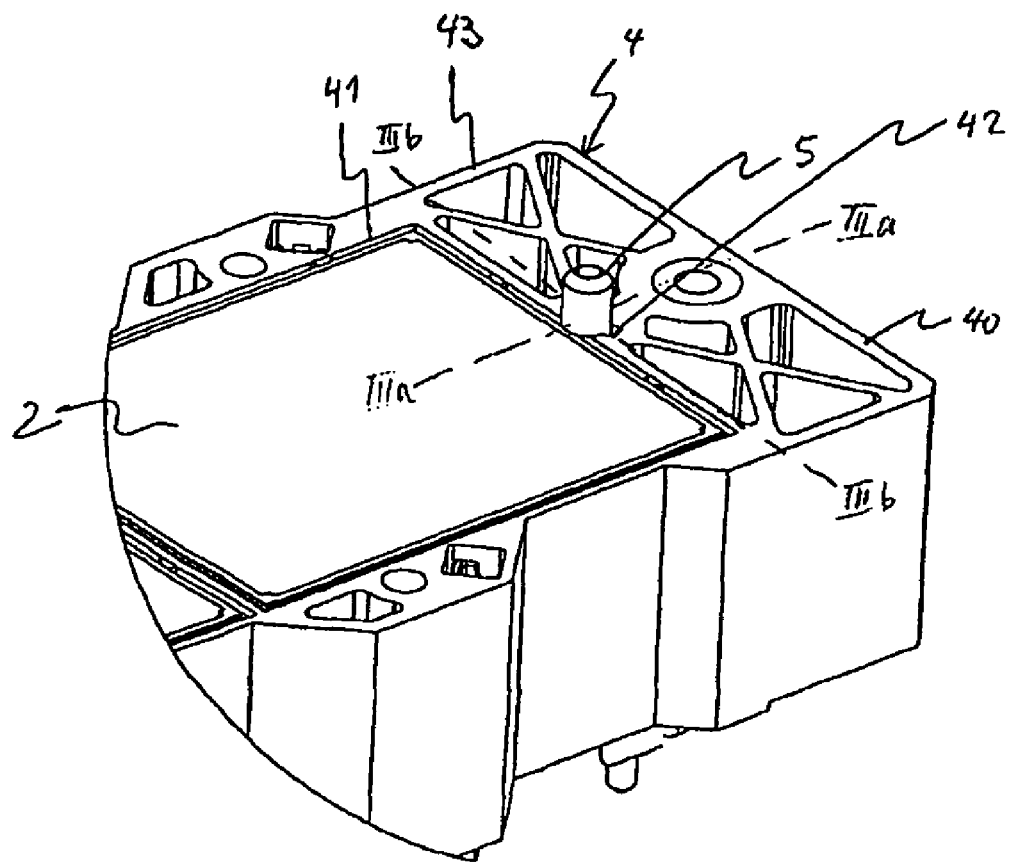
FIG. 2 shows a detail of FIG. 1.

FIG. 2 shows an enlarged view of the right-hand part of housing 4 illustrated in FIG. 1.

Figure 3A:
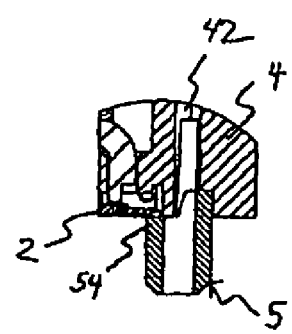
FIGS. 3a, 3b and 3c show sections through a holding element, which has been introduced into a housing recess in accordance with the invention.

FIG. 3a shows a section through holding element 5, as illustrated in FIG. 2, along the section line IIIa indicated in FIG. 2. Holding element 5 engages in a recess 42 in housing 4. Holding element 5 has a projection 54, which rests on lower face 40 of housing 4 (FIG. 2). Projection 54 on holding element 5 projects from circumferential frame 43 of housing 4 towards substrate 2. Projection 54 is used as a stop for substrate 2, and limits the movement of substrate 2 in the direction of lower face 40 of housing 4. This means that holding element 5 fixes substrate 2, and secures it against falling out of recess 41.

Figure 3B:
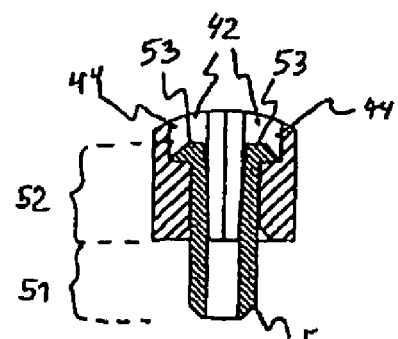
Figure 3C:
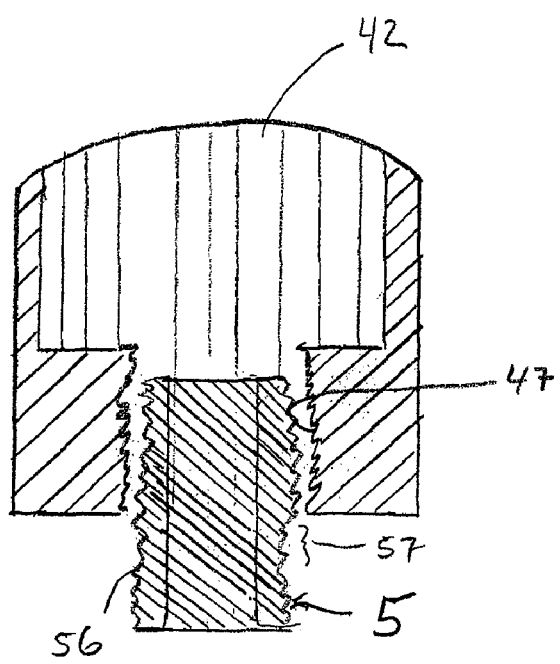

FIG. 3b shows a section through holding element 5 along the section line IIIb indicated in FIG. 2. That section 51 of holding element 5 which faces the heat sink (not shown in FIG. 3b) has a cup-shaped outline. That section 52 of holding element 5 which engages in housing recess 42 has two latching fingers 53, which engage in corresponding latching depressions 44 in recess 42, thus resulting in a snap-action latching connection between holding element 5 and housing 4.

FIG. 3b shows a section through holding element 5 also along the section line IIIb indicated in FIG. 2. A section 56 of holding element 5 has an external thread 57 which engages an internal thread 47 of recess 42, thereby forming a screw connection therebetween.

Figure 4:
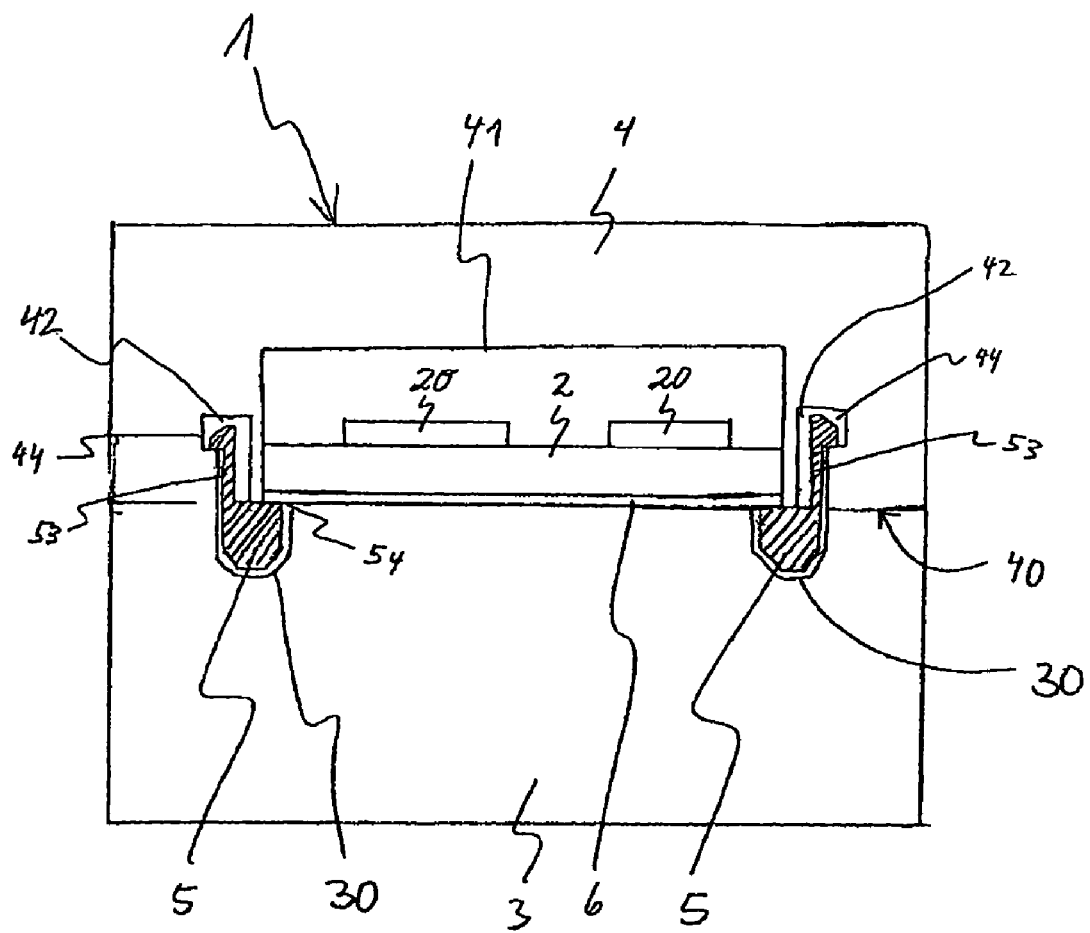
FIG. 4 shows a cross-section through an arrangement according to the invention.

FIG. 4 shows a cross-section through an arrangement according to the invention. The arrangement shows power semiconductor module 1 comprising substrate 2 having two power semiconductor elements 20, housing 4, and a heat sink 3 for dissipation of waste heat from power semiconductor elements 20. Housing 4 has a cutout 41, which is arranged on a lower face 40 of housing 4, facing heat sink 3, for holding the substrate 2. Furthermore, power semiconductor module 1 has two holding elements 5, which engage in respective housing recesses 42, associated with holding elements 5, on the lower face 40 of the housing 4, and limit any movement of substrate 2 in the direction of lower face 40 of housing 4. Preferably, a thermally conductive layer 6, which is preferably formed from a thermally conductive paste, may be located between substrate 2 and heat sink 3. Housing recesses 42 have latching depressions 44. Corresponding latching fingers 53 on holding elements 5 engage these latching depressions 44. Holding elements 5 are fixed in or to housing 4 by means of latching snap-action connections which are formed by latching fingers 53 and latching depressions 44. Heat sink 3 has two recesses 30, in which holding elements 5 engage. The shape of those sections 51 of holding elements 5 which engage recesses 30 is matched to the shape of recesses 30 in heat sink 3, as a result of which housing 4 can be positioned only in a desired and defined position on heat sink 30.

Figure 5:
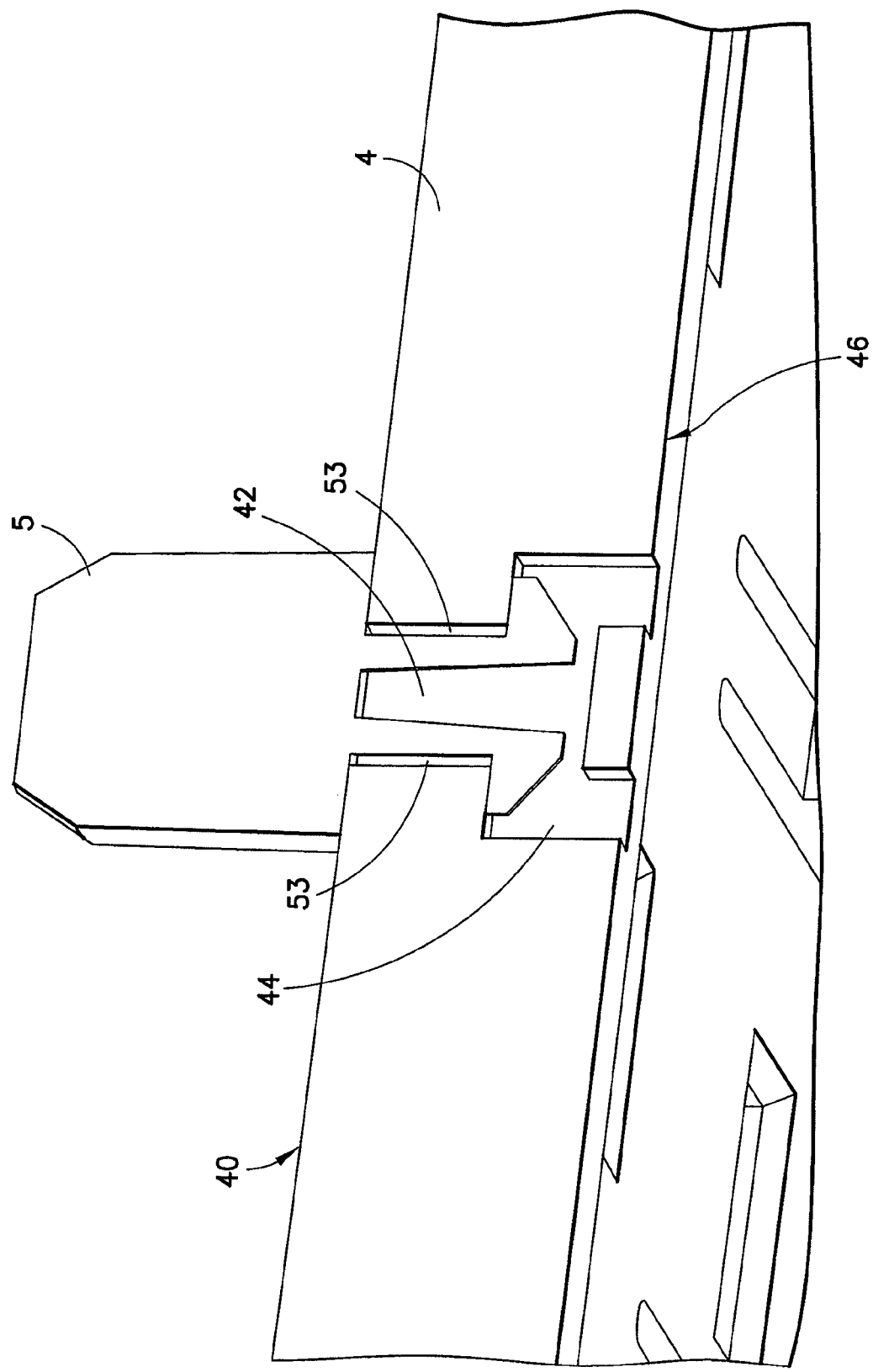
FIG. 5 shows a perspective section through a holding element in the housing frame.

FIG. 5 shows a section through a holding element 5 which engages in an associated recess 42 in a housing 4. Holding element 5 is introduced into recess 42 from lower face 40 of housing 4. Holding element 5 has two latching fingers 53, which latch into a corresponding latching depression 44 in recess 42. Introduction of a suitable tool from upper face 46 of housing 4 makes it possible to move the spring latching fingers 53 towards one another, as a result of which the latching snap-action connection is detached, and holding element 5 can be removed from housing 4 without being destroyed.

FIGS. 6a to 6d show various views of a holding element 5 such as in the inventive power semiconductor module shown in FIG. 1.

Figure 6A:
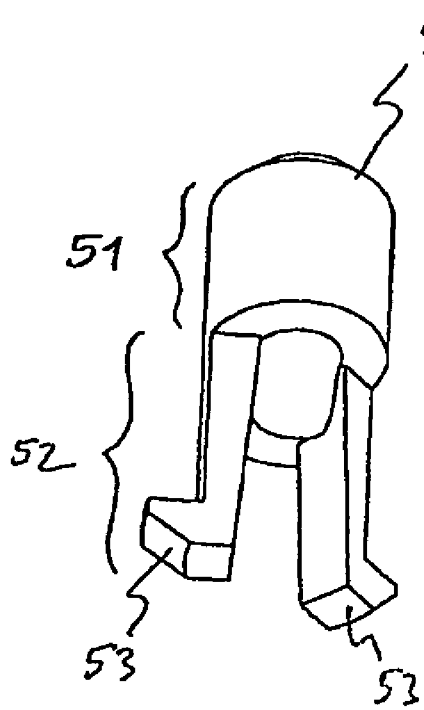
FIGS. 6a to 6d show various views of a holding element.

FIG. 6a shows an oblique view from underneath of holding element 5. Holding element 5 has an upper section 51, which engages in a recess 30 (shown in FIG. 4) in heat sink 3, as well as a lower section 52, which engages housing recess 42 in housing 4 (also shown in FIG. 4). Lower section 52 has two spring latching fingers 53 which, together with associated recess 42 in housing 4, form a latching snap-action connection.

Figure 6B:
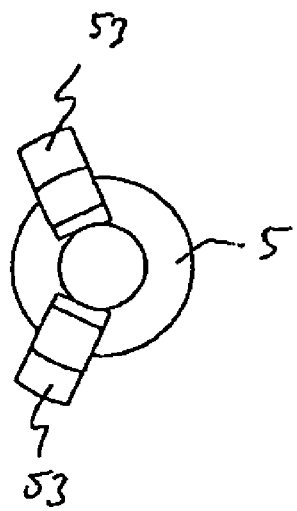

FIG. 6b shows a view from underneath of the holding element 5 illustrated in FIG. 6a.

Figure 6C:
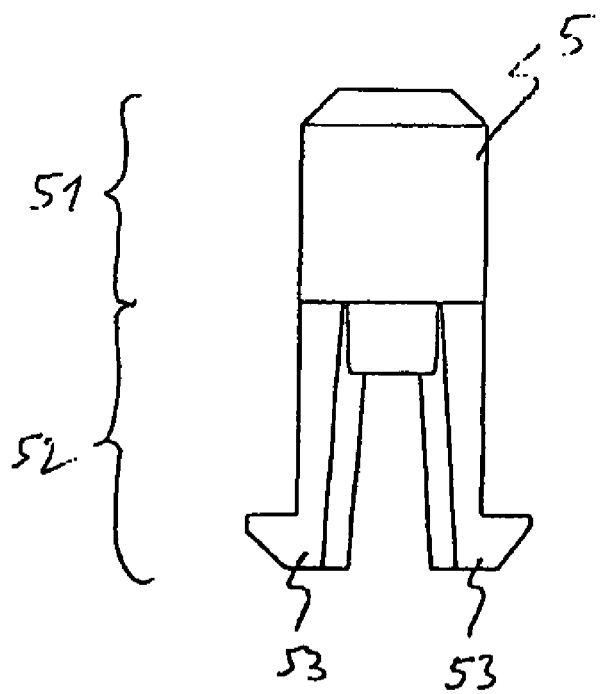

FIG. 6c shows a side view of holding element 5 illustrated in FIG. 6a.

Figure 6D:
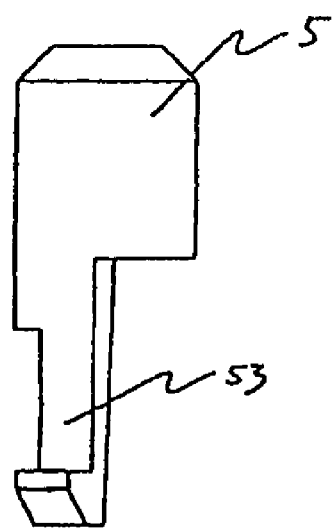

FIG. 6d shows a second side view of holding element 5 illustrated in FIG. 6a.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
    a substrate having at least one power semiconductor element disposed thereon;
    a heat sink, thermally coupled to said substrate, for dissipating heat from said at least one power semiconductor element, said heat sink including a first recess;
    a housing for holding said substrate and said heat sink in relative positions, said housing having
        a cutout on a lower face of said housing facing said heat sink, for holding said substrate, and
        a second recess disposed on said lower face of said housing; and
    at least one holding element which engages said second recess and is configured so as to limit movement of said substrate in the direction of said lower face of said housing, and is also configured to engage said first recess to couple said housing to said heat sink.

2. The power semiconductor module of claim 1, wherein said recess in said heat sink is formed so as to have a shape which complements a shape of a section of said at least one holding element that faces said heat sink and engages in said recess in said heat sink.

3. The power semiconductor module of claim 1, wherein a section of said at least one holding element which faces said heat sink is generally cylindrical.

4. The power semiconductor module of claim 1, wherein said holding element includes a projection which projects into said cutout for holding said substrate in position, and limits the movement of said substrate in the direction of said lower face of said housing.

5. The power semiconductor module of claim 1, wherein said housing includes a circumferential housing frame in which said recess in which said at least one holding element is disposed.

6. The power semiconductor module of claim 1, wherein said recess on said lower face of said housing is formed as a blind hole which is open towards said lower face of said housing and in which said at least one holding element engages said housing from said lower face of said housing.

7. The power semiconductor module of claim 1, wherein said at least one holding element is formed as a latching/centering holder.

8. The power semiconductor module of claim 1, wherein said at least one holding element is detachably connected to said housing.

9. The power semiconductor module of claim 8, wherein said holding element is threadedly engaged with said housing.

10. The power semiconductor module of claim 8, wherein said recess in said housing includes a latching depression, and said at least one holding element includes a spring latching finger which engages said latching depression.

11. The power semiconductor module of claim 1, wherein said at least one holding element is adhesively bonded to said housing recess.

12. The power semiconductor module of claim 1, wherein the power semiconductor module comprises at least two holding elements.

13. The power semiconductor module of claim 12, wherein the power semiconductor module comprises three holding elements.

14. The power semiconductor module of one of claim 1, further comprising a thermally conductive paste disposed between said substrate and said heat sink.

15. A method for producing a power semiconductor module, the method comprising:
    providing a housing having a lower face, said lower face of said housing including a cutout and a first recess;
    inserting a substrate having at least one power semiconductor element into said cutout;
    positioning a heat sink having a second recess in thermal contact with said substrate, and facing said lower face of said housing; and
    introducing at least one holding element into said first recess on said lower face of said housing to limit movement of said substrate in the direction of said lower face of said housing, and also into said second recess to couple said housing to said heat sink.

16. The method of claim 15, wherein said heat sink includes a recess and the method further comprises the step of:
    positioning said housing on said heat sink such that said at least one holding element engages in said recess in said heat sink.

17. The method of claim 15, further comprising the step of:
    applying a thermally conductive paste on that face of said substrate which faces said heat sink, before said at least one holding element is introduced into said recess in said housing.

* * * * *